United States Patent [19]

Muraoka

[11] Patent Number: 4,654,679
[45] Date of Patent: Mar. 31, 1987

[54] STATIC INDUCTION THYRISTOR WITH STEPPED-DOPING GATE REGION

[75] Inventor: Kimihiro Muraoka, Yokohama, Japan

[73] Assignee: Toyo Denki Seizo Kabushiki Kaisha, Tokyo, Japan

[21] Appl. No.: 656,581

[22] Filed: Oct. 1, 1984

[30] Foreign Application Priority Data

Oct. 5, 1983 [JP] Japan .................. 58-185112
Jan. 20, 1984 [JP] Japan .................. 59-7270

[51] Int. Cl.[4] ........................................... H01L 29/80
[52] U.S. Cl. ........................................ 357/22; 357/20; 357/38; 357/43; 357/86; 357/89
[58] Field of Search ................... 357/22, 38, 20, 43, 357/86, 89

[56] References Cited

U.S. PATENT DOCUMENTS

| | | | |
|---|---|---|---|
| 4,216,029 | 8/1980 | Ohki | 357/22 |
| 4,275,408 | 6/1981 | Yukimoto | 357/38 |
| 4,345,266 | 8/1982 | Owyawg | 357/38 |
| 4,364,072 | 12/1982 | Nishizawa | 357/38 |

FOREIGN PATENT DOCUMENTS

| | | | |
|---|---|---|---|
| 1154879 | 10/1983 | Canada | 357/38 T |
| 3002526 | 8/1980 | Fed. Rep. of Germany | 357/38 T |
| 54-106176 | 8/1979 | Japan | 357/38 T |
| 55-96677 | 7/1980 | Japan | 357/38 T |
| 56-6471 | 1/1981 | Japan | 357/22 G |

Primary Examiner—Joseph E. Clawson, Jr.
Attorney, Agent, or Firm—Bell, Seltzer, Park & Gibson

[57] ABSTRACT

A static induction thyristor having buried gate region having the concentration distribution of the impurity to have at least one stepwise variation viewed from the surface of the gate for improving dv/dt capability and for allowing more tolerance in the accuracy in the overetching and also for keeping variation of the gate resistance small. A static induction thyristor having buried gate region and having the high concentration layer given selective junction depth and to make shallow for the location situated above or below the gate region and may be provided with insulating layer between anode or cathode electrode for further improving dv/dt capability and also the gate loss at turn-on in high frequency operation and for improving manufacturing yield.

6 Claims, 19 Drawing Figures

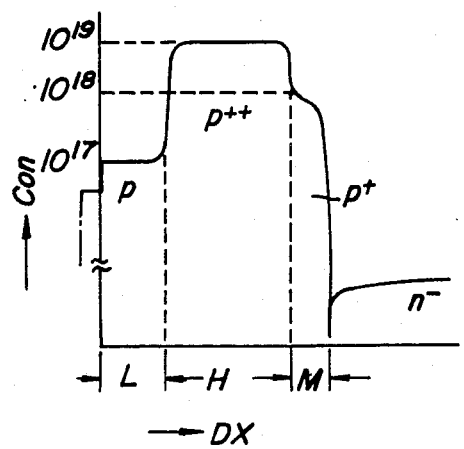
FIG_11
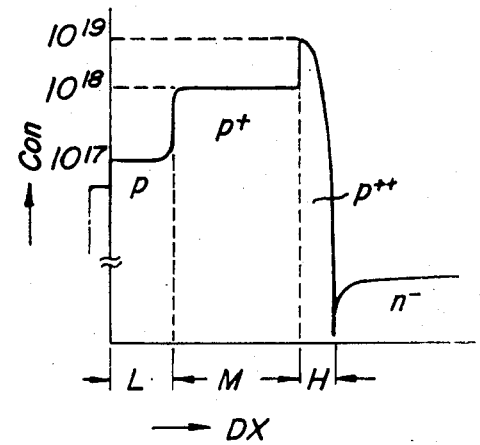
FIG_12
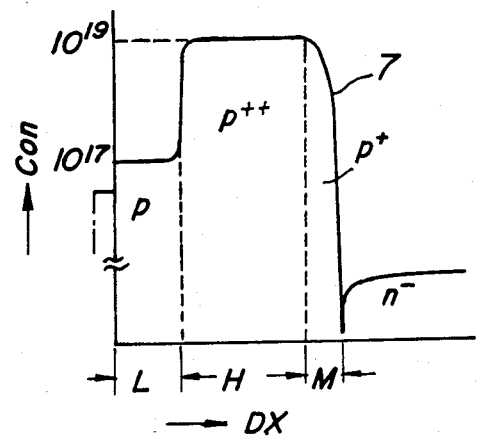
FIG_13

STATIC INDUCTION THYRISTOR WITH STEPPED-DOPING GATE REGION

BACKGROUND OF THE INVENTION

(1) Field of the Invention

The present invention relates to a static induction thyristor, and more especially to a static induction thyristor comprising a first high concentration layer provided at one surface of a semiconductor layer, a second high concentration layer provided at the other surface of said semiconductor layer, a buried region provided in the semiconductor layer, a cathode electrode provided on said surface, and an anode electrode provided on the other surface.

(2) Description of the Prior Art

Before explaining the static induction thyristor of the present invention, explanation for the already disclosed static induction thyristor having the buried gates will be given by referring to FIGS. 1-3.

FIG. 1 is a schematic cross-sectional view for showing a static induction thyristor having conventional buried gate construction and FIG. 2 is a simplified equivalent circuit diagram of the thyristor shown in FIG. 1.

In FIG. 1, the reference numeral 1 generally indicates a static induction thyristor comprising a first high concentration layer, for instance, an n+ layer 4 provided on the side of one surface 3 of a semiconductor layer 2 of n type for instance, a second high concentration layer, for instance, a p+ layer 6 provided on the side of the other surface 5, a gate region 7 provided on the side of the surface 3 of said semiconductor layer 2 and buried gate regions 8 embedded in the semiconductor layer 2. The both gate regions 7 and 8 together function as the gate. The region 7 and the buired gate regions 8 are both formed by diffusion method. Further a cathode electrode 9 is provided on the first high concentration layer 4, an anode electrode 10 is provided below the second high concentration layer 6 and a gate electrode 11 is provided on the gate region 7. These electrodes can be formed by aluminium for instance. A supporting electrode 12 is provided below the anode electrode 10 and these two parts together act as the anode.

Device construction along line A—A is the conventional thyristor of p-n-p-n 4 layer structure and that along line B—B is a diode part having p+-n-n+ structure.

The equivalent circuit diagram of this kind of thyristor is schematically shown in FIG. 2. As can be seen from the equivalent circuit diagram, it comprises a p-n-p transistor $T_1$ and an n-channel static induction transistor $T_2$ of which source S is connected to the cathode electrode 9, gate G is connected to the gate electrode 11, and drain D is connected to base B of the transistor $T_1$ and the emitter E of the transistor $T_1$ is connected to the anode electrode 10.

Considering the respective regions of the device shown in FIG. 1 and the elements shown in FIG. 2, it is to be noted that the emitter E corresponds to the second high concentration layer (p+ layer) 6, the base B and the drain D correspond to the substrate (n-layer) 2a, the collector C and the gate G correspond to the gate regions 7 and 8 and the source S corresponds to the first high concentration layer (n+ layer) 4. As can be understood clearly from FIG. 2, the illustrated thyristor 1 comprises a series connection of a p-n-p transistor $T_1$ and a static induction transistor (which may be abridged as SI transistor) $T_2$ having no amplifying function. Accordingly, this static induction thyristor 1 has a higher dv/dt capacity at immediate after the turn-off compared with a conventional p-n-p-n four layer structure thyristor basically having a series connection of a p-n-p transistor having a current amplifying function and an n-p-n transistor.

However, in practically manufacturing the thyristor having construction as shown in FIG. 1, the p+ gate regions 7 and 8 are formed on the n type substrate 2a by diffusion method and thereafter an arrangement is made to bury the formed p+ gate regions 8. Namely, an n type epitaxial layer 2b is grown on the substrate 2a and the semiconductor layer 2 is formed and the thyristor is manufactured. Between the channel area of the thyristor and the gate area of said thyristor there is the following relation;

channel area < < gate area

In a practical embodiment, the gate area is 6-10 times larger compared with the channel area. Since the gate and the channel are in the above relation for the size of the area, the equivalent circuit diagram of the static induction thyristor shown in FIG. 1 will not be a simple one as shown in FIG. 2 but it behaves as a diagram as shown in FIG. 3, in which the static induction transistor $T_2$ is connected with a parasitic n-p-n transistor $T_3$. Namely, the parasitic n-p-n transistor $T_3$ having a large gate area and having current amplifying function is connected in parallel with the static induction transistor $T_2$ essentially having no current amplifying function. By this reason, there had been a trouble that by the charging current for charging the static capacity of the depletion layer caused by the re-applied voltage between the anode and the cathode after the rupturing of the main current, the parasitic n-p-n transistor $T_3$ might become ON condition and the static induction thyristor may be turn-off failure. By this cause of trouble, the static induction thyristor having construction shown in FIG. 1 has a drawback in that the dv/dt capability immediately after the turn-off can not be so large as expected.

This cause is further considered by referring to FIGS. 4 and 5.

As can be seen from FIG. 4, when the p+ gate regions 8 are formed by the diffusion method, p type impurity boron, which has masking effect against an oxide film and resulting a high surface concentration is selectively diffused through windows 14 provided in the oxide film 13. The boron atoms diffused from the window having width (W) are distributed into the silicon substrate body from the point Z located at bottom surface of the window 14 along X and Y axes in accordance with the diffusion equation. The concentration distribution of boron shows a sudden decrease according to an exponential function or error function according to an increase of distance from the point Z along the X and Y axes. It is preferred to raise the surface concentration of boron at the point Z since it results a smaller gate resistance of the static induction thyristor and a shorter gate turn-off time. On the other hand, boron has relatively small atomic radius which is 74% of that of silicon so if the diffusion is made at the surface concentration in an order of $10^{19}$ atoms/cc and in the depth of 15-20 μm, crystal defects might be caused in the surface of the silicon substrate (of the order of $10^{13}$ atoms/cc).

Accordingly, a high quality epitaxial layer can not be obtaind by epitaxial growth of n-type silicon single-crystal in an order of $10^{14}$–$10^{15}$ atoms/cc on the p+ gate surface having such defects so that yields of manufacture deteriorates. By the above reason, the surface concentration at the point Z of the gate region 8 is limited and its possible range in the present industry is $5 \times 10^{17}$ ~ $5 \times 10^{18}$ atoms/cc.

When the surface concentration of the point Z is made $1 \times 10^{18}$ atoms/cc and the depth of p gate (in X axis) is made 20 μm, the diffusion in the direction of Y axis is 14 μm. The distances viewed from the point Z to points along X and Y axes to points at which the concentration decreases down to $6$~$8 \times 10^{16}$ atoms/cc are at least 13 μm and 10 μm, respectively. There is formed a depletion layer 15 as shown in the drawing (FIG. 5). Accordingly, the p+ gate region 8 has a construction of p+-n-p-n+ as indicated by arrows and current will flow for charging up the depletion layer 15. This is the region to operate as the conventional 4 layer construction thyristor. If the boron concentration is more than about value of $1 \times 10^{17}$ atoms/cc along X and Y axes, the function of the conventional 4 layer construction thyristor is not achieved as is known empirically. By the aforementioned reason, in the static induction thyristor formed by the gate diffusion method having construction shown in FIG. 1, there is a region having the same function with the conventional p-n-p-n 4 layer construction thyristor about cross-section around the gate along the line A—A. This region is very important and can not be ignored since the following relationship exists for the static induction thyristor.

channel area < < gate area

Due to this fact, the equivalent electric circuit diagram of FIG. 3 is considered and in which n-p-n transistor operation prevails and the essentially high dv/dt capability of the static induction thyristor is not achieved.

Furthermore, in a static induction thyristor of buried gate construction having p-gates formed by diffusion method, the gate electrodes are formed from the buried gates, the epitaxial grown layer formed over the gate surface should be removed by dry or wet etching process. In this occasion, if the etching is applied to a depth exceeding the thickness of the epitaxial layer, the blocking voltage between the anode and the gates may remarkably decrease from an intended design value and this may causes problem.

The cause of this will be explained by referring to FIG. 6.

In order to form the gate electrodes as shown in FIG. 6, it is necessary to apply a working to remove up to depth l which substantially corresponds to the thickness of the epitaxial layer. Thus disposed gate surface is applied with an aluminium electrode. In this case, according to an increase of removing depth l of the gate and an increase of the thickness of the epitaxially grown layer, an over-etching d' is resulted in the following relationship.

amount of over-etching (d') = removing depth (l) − thickness of epitaxial layer (d)

By this the blocking voltage between the anode and the gate decreases. This reason is considered from the followings. When the reverse voltage is applied to the gate junction, the depletion region 15 bearing said reverse voltage mainly expands towards n-layer side, but a small part thereof also expands towards p+ side of the gate layer. Accordingly, if the amount of the over-etching (d') increases, the depletion layer 15 expanded towards p+ gate side may reach the gate electrode. From this, the voltage bearing facility of the gate junction is disturbed and the blocking voltage between the anode and the gate thus decreases. The main cause for this is a sudden variation of the concentration from point Z (refer to FIG. 4) in the formation of the gate by the diffusion method.

Herein, the relation between the anode-gate blocking voltage $V_{AG}$ and the etching amount l at the time of removal is shown in FIG. 7. As can be seen therefrom, for obtaining the intended anode-gate blocking voltage $V_{AG}$, the over-etching amount d' should be limited within a few μm. However, it is a difficult problem to limit the over-etching amount d' within a few μm against the thickness of the epitaxial layer of 15-20 μm. This will be a big bar at an attempt to enlarge the surface area of the element. On the contrary, if the etching amount l is insufficient at the time of exposing the gate electrodes, i.e. when the p-gate surface is not exposed, a problem exists in that the gate-cathode blocking voltage can not be maintained due to the fact that the gate and the cathode are short-circuited by the n-layer.

If we can realize a construction having no concentration variation along the X-axis, the problems explained above may not occur. Further, there is another problem relating to the over-etching amount d' and this is the gate resistance. The gate resistance mainly depends on the etching distance viewed from the point Z. This means a fact that the concentration distribution along X-axis varies suddenly at said point Z. Namely, the gate resistance becomes high according to an increase of the over-etching amount. In a static induction thyristor having a definite channel interval, the turn-off time Tq increases according to an increase of the gate resistance as can be seen from an experimental data shown in FIG. 8.

FIG. 8 shows a relation between the gate resistance Rg and the turn-off time Tq at the time of turn-off.

Namely, many samples having low gate resistance Rg have much shorter gate turn-off time. Whereas those having high gate resistance Rg may have longer gate turn-off time Tq.

From this fact, it can be said that the undue increase of the etching amount is undesirable since it causes an increase of the gate turn-off time of the static induction thyristor. The main reason for this is that the gates are formed through diffusion method and the concentration distribution from Z-axis shows sudden variation. If it can be realized a construction in which the concentration distribution of the gate along X-axis shows no variation, the aforementioned problem will not happen.

Furthermore, when we consider a case in which gate is positively biassed for turn-on a thyristor, there is a p+-n-n+ diode between the gate and the cathode of the thyristor since there is a high concentration layer (n+ layer) on the top of the buried gate region 8 buried in the semiconductor layer 2. By this reason, there has been a drawback in that the gate loss (gate turn-on current) is large at high frequency operation.

Still further, if the epitaxial growing is applied over a substrate of a large surface area, defects may be involved in the epitaxial growing layer. In such a defect portion, the diffusion speed of n+ impurity atom is high and the diffusion is spread in a more deep place. Therefore, a disadvantage for lowering cathode-gate blocking voltage is caused by the short circuit of p+ buried gate regions. This may result decrease of manufacturing yield of thyristors.

Furthermore, when we consider a case in which the gates are positively biassed for turn-on the thyristor, it can be assumed that a p+-n-n+ diode is present between the gate and cathode of the thyristor since there is a high concentration layer (n+ layer) directly above the buried gate region 8 embedded in the semi-conductor region. By this reason, there has been a disadvantage in that the gate loss or the gate turn-on current is large at the turn-on in a high frequency operation.

Moreover, if the abovementioned epitaxial growing is applied on a large area substrate, the epitaxially grown layer may have defect portions. In such a defect portion, the diffusion speed of n+ impurity atom is high compared with non-defect portion so that the diffusion is effected at higher speed to deeper portion. Accordingly, there is a disadvantage in that the gate-cathode blocking voltage of the thyristor may be lowered by causing short-circuit of the buried gate regions. This may be one cause of lowering the manufacturing yield of the thyristor.

SUMMARY OF THE INVENTION

The present invention has for its object to mitigate aforementioned disadvantages of the conventional static induction thyristor and to realize a static induction thyristor having a novel construction being able to improve the manufacturing yields substantially.

In order to realize this object according to the present invention, a p-gate of high impurity concentration having increased concentration from the Z point of the p-gate towards X axis is formed instead of forming the p-gate by diffusion process. By arranging such a concentration distribution for the p-gate, a high dv/dt capability, which is the essential feature of the static induction thyristor, can be realized. The reason for this can be explained by the followings. The cross-section along line A—A of FIG. 1 shows p-n-p-n four layer construction thyristor. However, since the p-layer of the n-p-n transistor shown in FIG. 3 is substantially the same high concentration layer, the injection efficiency of the n-p-n transistor decreases greatly and the current amplification function also decreases very much and the characteristic of the static induction thyristor in FIG. 3 is enhanced.

At the time of disposing the gate, even there is an over-etching, the depletion layer induced at the gate junction will not reach to the gate electrode since the concentration distribution in the gate layer increases from the point Z along the direction of X axis. Accordingly, even if an over-etching had occured, the gate-anode blocking voltage will not decrease. Further when considering the fact of increase of the gate resistance caused by the over-etching, the gate resistance will not increase by the over-etching in the above gate construction. Accordingly, it is possible to manufacture the static induction thyristor having a high switching speed and a high dv/dt capability by the reason of high gate-anode blocking voltage and a low gate resistance at high yield rate.

In one aspect of the present invention, the aforementioned first high concentration layer is provided to have a shallow junction depth in an area directly above the buried gate region viewing the one side surface of the semiconductor layer from the buried gate along a cross-section taken in a direction normal to said layer and to have deeper junction depth in a semiconductor layer other than said region.

By such arrangement, particular effects can be obtained that the capability of dv/dt directly after the turn-off can be maintained at the desired high value, that the gate loss at turn-off in a high frequency operation can be kept small and that the manufacturing yield can be improved very much.

In a further aspect of the invention, the aforementioned second high concentration layer is preferably arranged to have shallow junction depth in a region directly below the buried gate region viewing the other side surface of the semiconductor layer from the buried gate region along a direction normal to said side surface and to have deeper junction depth of the second high concentration layer other than the above region in the semiconductor layer.

By this arrangement, the capability of dv/dt immediately after the turn-off can be raised further.

It is preferred to provide an insulating film between region directly below the gate region and the anode electrode in various embodiments of the invention.

By this arrangement, the effect of the invention can be increased further.

BRIEF DESCRIPTION OF THE DRAWINGS

FIGS. 11 to 13 are diagrams for showing the relation between the vertical distance DX of the gate region and the concentration distribution;

DESCRIPTION OF THE PREFERRED EMBODIMENTS

Figure 1:
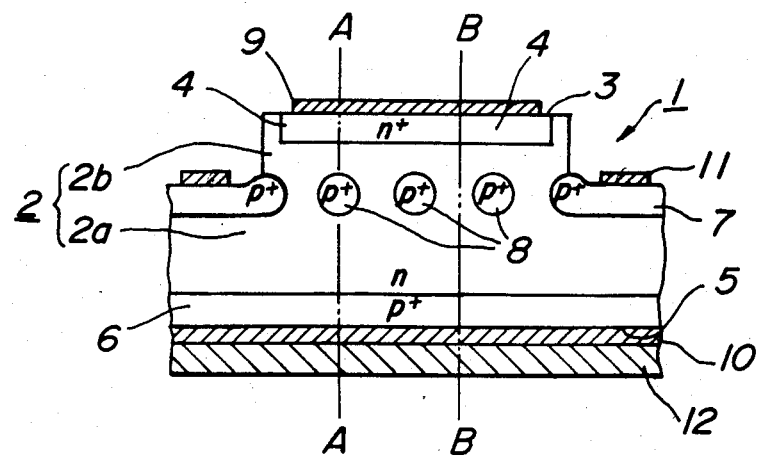
FIG. 1 is a cross-sectional view showing basic construction of a static induction thyristor of the conventional type, which has been explained in the foregoing.

The embodiments of the present invention will be explained hereinafter. As the difference in the construction between prior art product shown in FIG. 1 is only for the p-gate, this difference will be explained by referring to FIG. 9, which shows an embodiment of the gate construction arranged in an n-type substrate.

Figure 9:
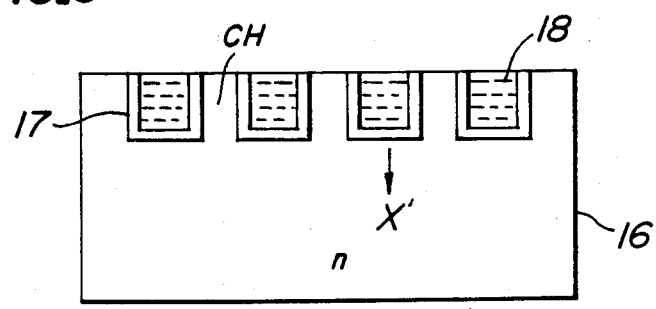
FIGS. 9 and 10 are cross-sectional views for explaining the formation of the buried p-gate by the epitaxial growing method according to the present invention.

FIG. 9 is an explanatory diagram for the formation of the buried gates. Reference numeral 16 designates the substrate, 17 the reentrant grooves, 18 the gates and CH designates channels. Namely, in an n-type substrate, at first the locations for forming the gates 18 are removed by working to have reentrant form and then the p-type diffusion layer is provided thereon to form reentrant grooves 17 with diffusion layer. Then by applying an epitaxial growing to fill up the reentrant grooves 17 by the epitaxial layer, the gates 18 are formed. By this steps, the gates 18 will have stepwise concentration distribution in X' direction (i.e. in vertical direction).

FIG. 11 is an example of the concentration distribution in such vertical direction. As can be seen from FIG. 11, the gate 18 has three layers of a low concentration layer L, a middle concentration layer M, and a high concentration layer H. In more detail, the gate 18 has in succession viewed from the surface towards direction X' and in accordance with an increase of distance DX, an epitaxial grown layer of p-type impurity having an order of concentration $10^{17}$ atoms/cc, then an epitaxial grown layer of an order of $10^{19}$ atoms/cc, and then a p-type diffusion layer of an order of $10^{18}$ atoms/cc. The reason of designing the concentration of p-type epitaxial layer at the surface of the gate 18 as low as $10^{17}$ atoms/cc is to avoid blocking or auto-doping of the channel CH by the impurity of p-gate at the time of gate filling epitaxial growth (in an order of n-type impurity concentration of $10^{14}$–$10^{15}$ atoms/cc) succeeding to the formation of the gate 18. The static induction thyristor 1' having gates manufactured in the abovementioned manner is as shown in FIG. 10 and it has the features set forth below.

Namely, the effective characteristics of the static induction thyristor provided with the gates made in accordance with the present invention are as follows.

(1) dv/dt capability

Figure 3:
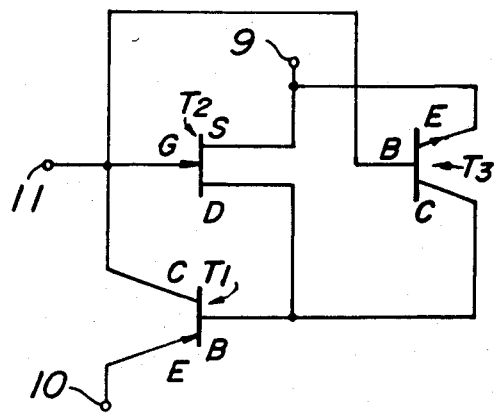
FIG. 3 is an equivalent circuit diagram of the same static induction thyristor of FIG. 1, which represents the actual embodiment more closely.
Figure 4:
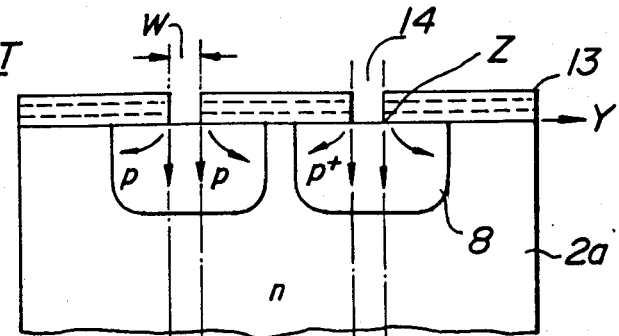
FIGS. 4 and 5 are enlarged cross-sectional view of the gate region for explaining the conventional manufacturing method for p+ gate through diffusion method.
Figure 5:
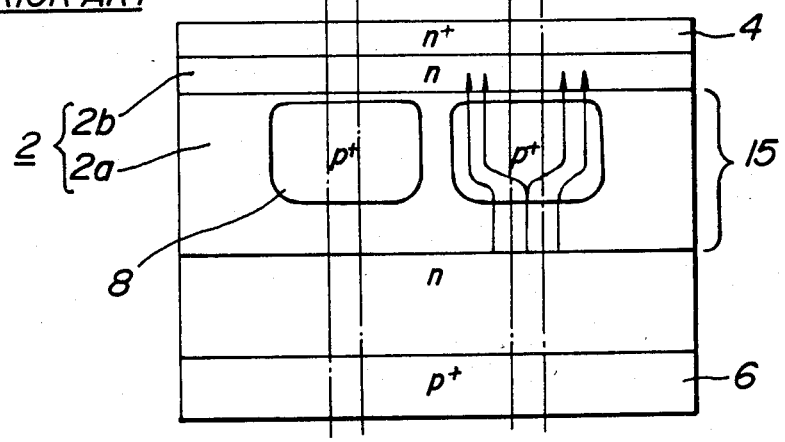
Figure 6:
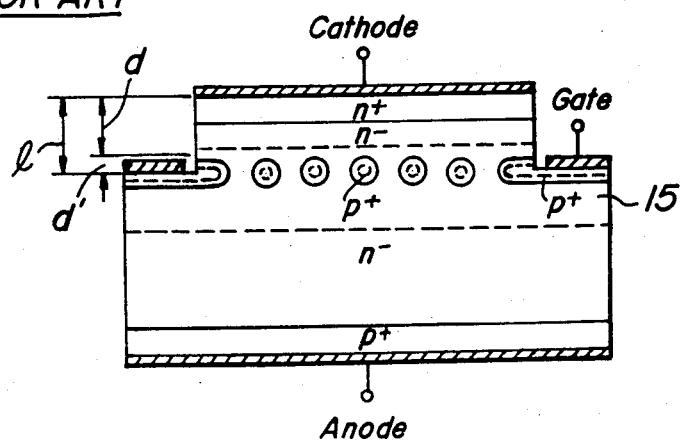
FIG. 6 is a cross-sectional view of a conventional static induction thyristor, which has been manufactured in a conventional method in which the gate electrodes are formed after the formation of p+ gate region through diffusion method.
Figure 7:
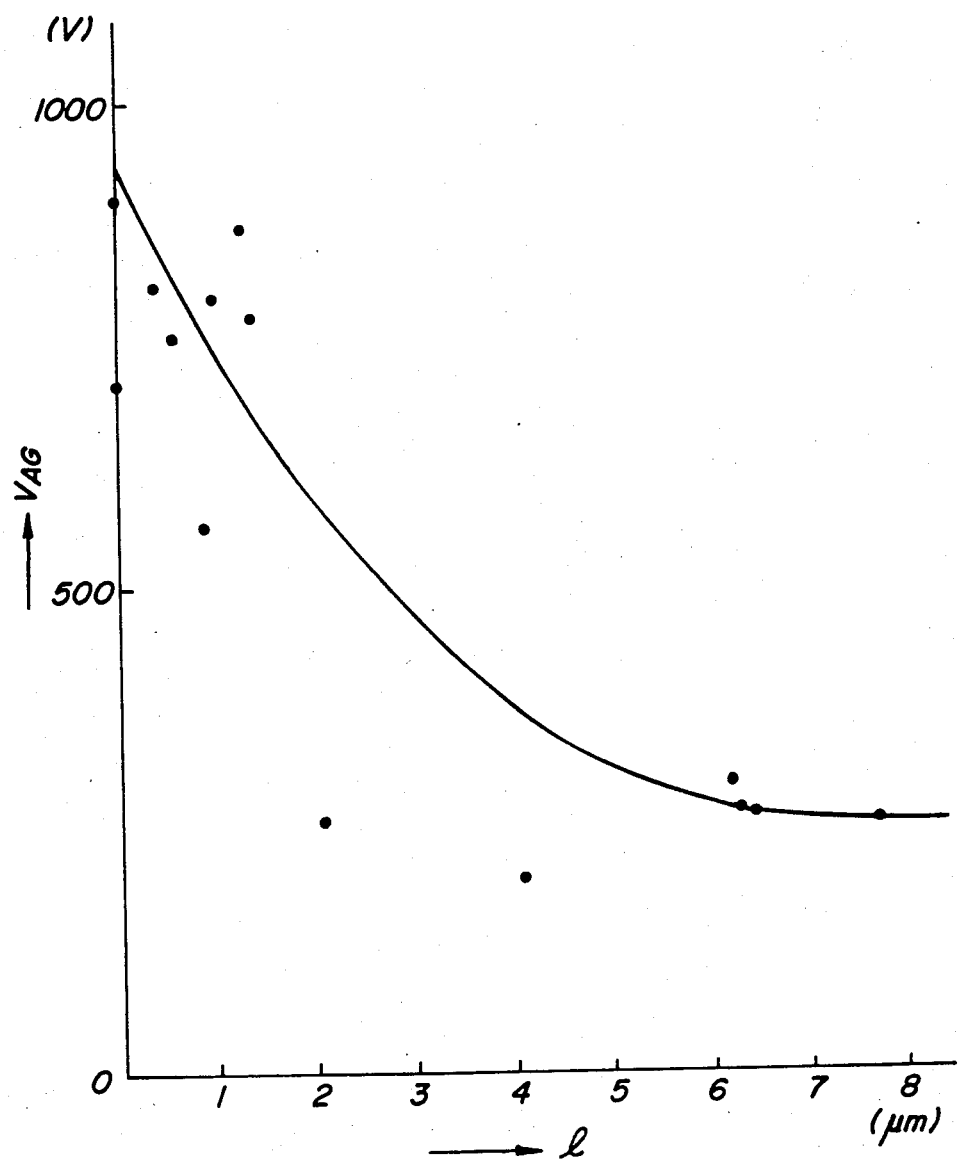
FIG. 7 is a diagram showing the relation between anode-gate blocking voltage $V_{AG}$ of the conventional static induction thyristor in ordinate and the etching depth l of the gate in abscissa.
Figure 8:
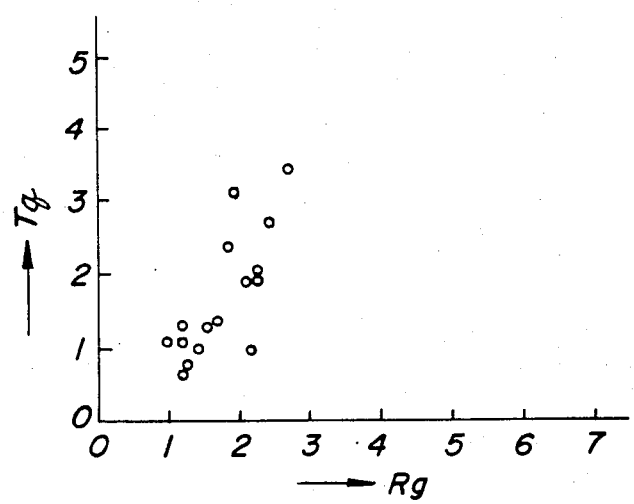
FIG. 8 is a diagram for showing the relation between gate resistance $R_g$ at the time of gate turn-off in the abscissa and gate turn-off time Tq in the ordinate.
Figure 10:
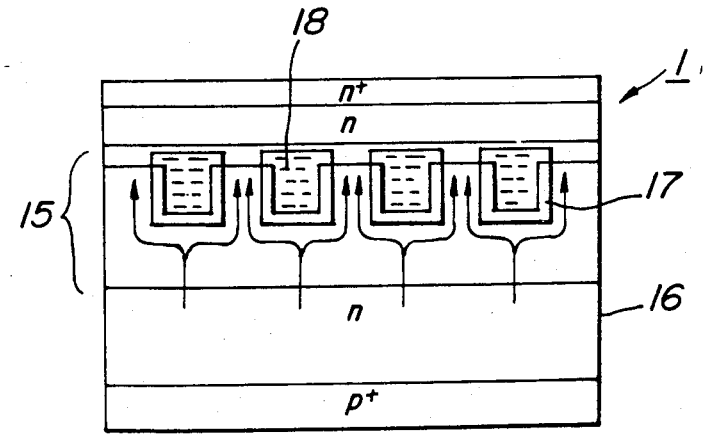

As can be seen from FIG. 10, the gate junction is surrounded by a depletion layer 15. The charging current for charging the static capacity of the depletion layer 15 shown by an arrow mark will not flow substantially through the gate. The reason for this is that the periphery of the gate 18 is a shallow high concentration depletion layer and that inside the depletion layer there is a more high concentration epitaxial grown layer surrounded thereby. Namely, there is a difference, as can be seen from FIG. 5 in that the current amplification function of the transistor $T_3$ of FIG. 3 is extremely small so that a high dv/dt capability is obtained since there is no sudden concentration variation in the X-axis direction.

(2) Over-etching amount at the time of gate formation and anode-gate blocking voltage The concentration distribution of the gate is as shown in FIG. 11. The depletion layer 15 expanding toward the middle concentration layer M of the p-type diffusion layer is interrupted by the high concentration layer H of the epitaxial layer. Under this situation, a much larger tolerance is allowed for the precision of over-etching compared with the conventional methods. Under an ideal condition, the above tolerance may be permitted up to the low concentration layer L of the epitaxial layer.

(3) The influence of the over-etching amount at the formation of the gate for the gate resistance The gate resistance is dependent on the concentration of the gate impurity and the depth thereof. By referring to FIG. 11, it can be considered that the gate resistance is decided by the high concentration layer H of the epitaxial grown layer. The amount of the over-etching is ideally made up to the low concentration layer L. Even the etching is made in excess of this low concentration layer L, the variation of the gate resistance is very small since the concentration distribution of the high concentration layer H of the epitaxial layer is considerably uniform.

By the abovementioned reason, the accuracy of the over-etching may have a considerable tolerance compared with the conventional method while keeping the variation of the gate resistance very small. By this same reason, the element can be made to have a larger surface area and a very quick switching speed can be realized since a uniform and low gate resistance can be obtained in the element.

FIGS. 12 and 13 show some possible modified embodiments of the invention having the same gate construction as that shown in FIG. 11. Relative comparison of the 3 concentration distributions shown in FIGS. 11 to 13 is shown in the following table.

|  | FIG. 11 | FIG. 12 | FIG. 13 |
|---|---|---|---|
| dv/dt capability | Excellent | Good | Superior |
| Anode-gate-blocking voltage and over-etching amount | Good | Good | Good |
| Over-etching amount and gate resistance | Excellent | Good | Superior |

Further modified embodiment of the static induction thyristor according to the present invention will be explained by referring to FIGS. 14–19.

Figure 14:
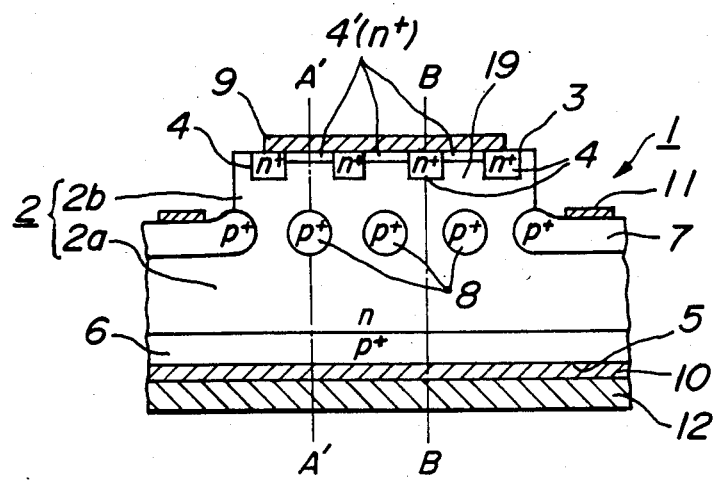
FIGS. 14 to 16 are cross-sectional views for showing construction of various embodiments according to the present invention.

FIG. 14 is a first modified embodiment of the present invention. In this embodiment, the first high concentration layer, for instance the n+ layer 4, is provided not to have a uniform junction depth over the whole surface region opposite to the cathode electrode 9. The n+ layer is provided to have different junction depth from said side surface 3 of the semiconductor layer 2 viewed from the buried gate region 8 normal to said side surface 3. Namely, at partial area 19 located immediately above the buried gate region 8 is formed as n+ layer 4' having shallow junction depth and the remaining area is formed as n+ layer 4 having deep junction depth.

The constructional difference of the static induction thyristor made according to this embodiment shown in FIG. 14 will be explained by comparing it with the conventional static induction thyristor shown in FIG. 1 and especially for the cross-sectional construction taken along lines A'—A' and B—B.

In the static induction thyristor of the conventional type, the junction depth of the first high concentration layer 4 is made uniform. In a practical embodiment of such a conventional type, the first high concentration layer 4 is made about 10 μm for the epitaxial grown layer 2b having thickness of 20 μm. Whereas in the embodiment of the present invention shown in FIG. 14, the first high concentration layer portion 4' on the line A'—A' is made to have the junction depth about 1-2 μm, which is some 1/5-1/10 of the junction depth 10 μm of the first high concentration layer 4 on the line B—B.

Usually the gate area of the static induction thyristor is about 6-10 times larger compared with the channel area. Therefore, according to this inventive construction, the probability for giving influence against the gate-cathode blocking voltage by the diffusion of n+ impurity atoms and by an abnormal diffusion at some defect portion is very small, since the portion 4' of the first high concentration layer is made to have shallow junction depth as 1-2 μm. This will substantially contribute for an improvement for the gate-cathode blocking voltage.

Due to this construction, the emitter injection efficiency of the parasitic n-p-n transistor $T_3$ in the equivalent circuit diagram of FIG. 3 becomes very small on the line A'—A' compared with that of the conventional construction. Accordingly, the current amplification function of the parasitic n-p-n transistor $T_3$ decreases in accordance with the decrease of the emitter injection efficiency. The operation characteristic of the static induction transistor $T_2$ is enhanced due to the decrease of the current amplification function of the parasitic transistor. As the result, the static induction thyristor according to the present invention will have much higher dv/dt capability after turn-off compared with the conventional static induction thyristor.

In the static induction thyristor shown in FIG. 14, the distance between the buried gate region 8, which is the p+ layer, and the part of first high concentration layer 4' as can be seen on the line A'—A' is longer than the distance between the buried gate region 8 and the first high concentration layer 4 located on the line B—B. Accordingly, the thyristor of this embodiment will have higher gate cathode resistance compared with the conventional thyristor having p+-n-n+ junction at the corresponding portion and hence the amount of current is suppressed.

By the reason mentioned above, the static induction thyristor made in accordance with the present invention and having the construction shown in FIG. 14, has a remarkable advantage in that the gate loss at turn-on time is very small under high frequency operating condition compared with that of the conventional thyristor having construction as shown in FIG. 1.

As the method of selectively forming the subdivided n+ layer 4 and n+ layer 4' on the side surface 3 of the semiconductor layer 2, known methods such as oxidized film forming method, photolithographic method or usual diffusion method can be used.

In the construction shown in FIG. 14, the subdivided n+ layer 4 and n+ layer 4' at the cathode surface of the semiconductor layer 2 are short-circuited by the aluminium electrode, i.e. the cathode electrode. By this reason, the blocking voltage between the cathode and gate of the thyristor may be limited at some extent by a presence of default in the epitaxial layer.

In view of the above possible disadvantage, there is a need to further improve the gate-cathode blocking voltage according to the use of the device.

Figure 15:
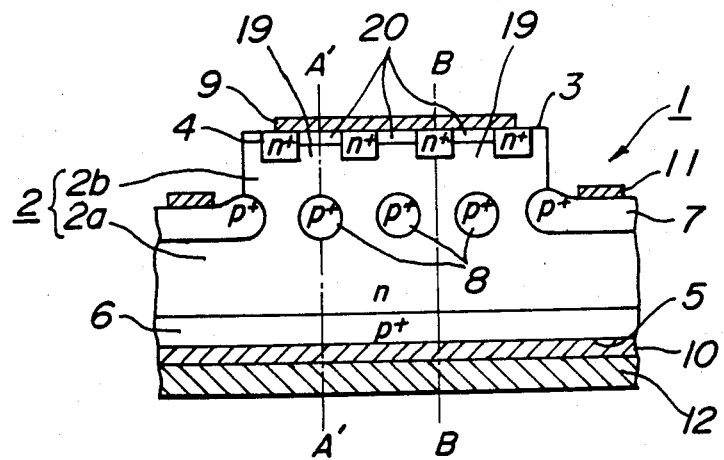

Another embodiment of the present invention shown in FIG. 15 is arranged to improve this gate-cathode blocking voltage. In this embodiment, in the region of semiconductor layer 2 as shown in FIG. 14, namely between the region 19 located immediately above the buried gate region 8 and the cathode electrode 9, there is provided an insulating layer 20 or an insulating film 20. This insulating film may be oxide film or nitride film. By providing such an insulating layer 20, the directly formed current path extending from the cathode electrode 9 to the n layer 19 located intermittently with the n+ layer 4 located at the cathode surface is interrupted electrically.

By the electric insulating function of the insulating layer 20, the gate-cathode blocking voltage of the thyristor is improved since the formation of the short circuit between the n+ layer 4 and the n+ layer 4' by the cathode electrode 9 is prevented.

Figure 2:
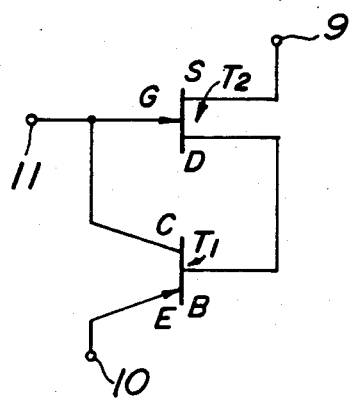
FIG. 2 is a simplified equivalent circuit diagram of the conventional static induction thyristor shown in FIG. 1.

Also the operation of the parasitic n-p-n transistor $T_3$ shown in the equivalent circuit diagram of FIG. 3 is prohibited and the equivalent circuit diagram becomes as shown in FIG. 2. Accordingly, the capability of dv/dt of the static induction thyristor of this embodiment immediately after the turn-off becomes higher compared with that of the conventional thyristor shown in FIG. 1.

Furthermore, the current path portion among the total current path extending from the buried gate region 8 to the cathode electrode 9 corresponding to the partial region having only the p+-n junction is insulated so that the current path is substantially bounded only to that portion corresponding to the part of region having p+-n-n+ junction.

In the conventional construction shown in FIG. 1, no such insulating layer for interrupting the current path is provided. The current path in the FIG. 15 embodiment is narrower than that of the conventional construction shown in FIG. 1 and hence the amount of current passing between the gate and cathode of the thyristor decreases remarkably. In other words, the resistance between the gate and cathode of the thyristor becomes higher. Due to this fact the static induction thyristor of the FIG. 15 embodiment has an advantage in that the gate loss at turn-on in high frequency operation is substantially small compared with thyristor having the conventional construction shown in FIG. 1.

The embodiment shown in FIG. 15 has still further advantage to remarkably improve the manufacturing yield of the thyristor by the improvement of the gate-cathode blocking voltage. This is by the reason that no high concentration layer, namely no n+ diffusion layer is provided at the region 19 of the semiconductor layer immediately above the buried gate region 8 having substantially larger gate area than the channel area (in practice 1:6-1:10) and that part of the region 19 is inactivated by the provision of the insulating layer 20 so that the occurrence of the fault due to default of the epitaxially grown layer 2b itself can be avoided.

The selective formation of the insulating layer 20 mentioned in the foregoing can be effected through known technique such as oxidation technique, photolithography or etching.

Figure 17:
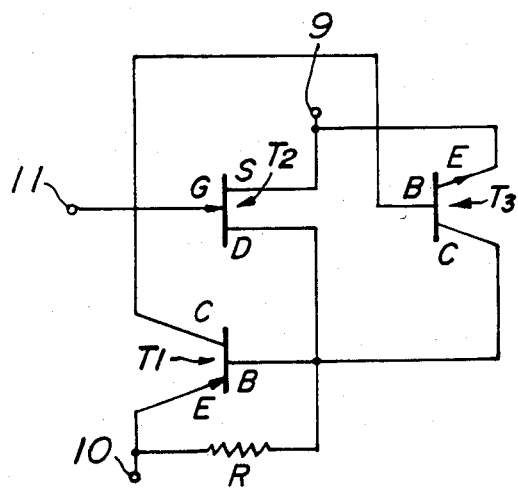
FIG. 17 is an equivalent circuit diagram of the static induction thyristor of the present invention shown in FIG. 16.

FIG. 17 shows still further embodiment of the present invention. In this embodiment, the dv/dt capability immediately after turn-off of the thyristor in FIG. 14 embodiment can further be improved.

The construction on cross-section along line A'—A' of the FIG. 14 is p+-n-p+-n junction construction (4 layer construction). By the presence of such a 4 layer construction, the dv/dt capability immediately after turn-off can not be a high amount being the essential feature of the static induction thyristor.

Figure 16:
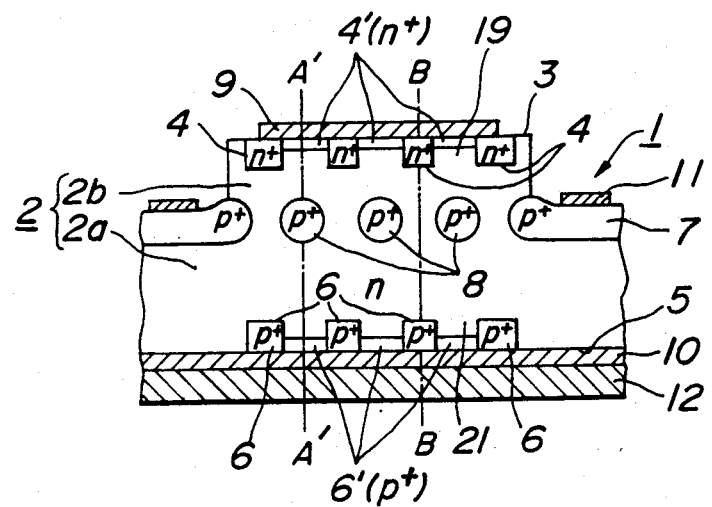

Whereas in the embodiment shown in FIG. 16, the construction shown in FIG. 14 had further been modified. In addition to the modification of the first high concentration layer, the second high concentration p+ layer 6 is made not to be uniform. Namely, viewed from the buried gate region 8 towards the other surface 5 of the semiconductor layer 2, the region 21 located directly below the buried gate region 8 is made to be p+ layer 6' having shallow junction depth and the other region of the semiconductor layer 2 is made to be p+ layer 6 of deep junction depth. In this embodiment shown in FIG. 16, the thyristor is made to have the construction in that the buried gate region 8 is oppositely arranged against the anode electrode 10 and the cathode electrode 9 respectively, and that at both regions 19 and 21 of the semiconductor layer located immediately above and below of the buried gate region 8 there is not provided the n+ layer 4 of the first high concentration layer having deep junction depth and the p+ layer 6 of the second high concentration layer having deep junction depth. In a practical embodiment, the junction depth of the n+ layer 4' on the line A'—A' is 1-2 μm as same as that of FIG. 14 embodiment, the junction depth of n+ layer 4 on the line B—B is 10 μm. Whereas at the second high concentration layer side, the junction depth of the p+ layer 6' on the line A'—A' is 1-2 μm and that of the p+ layer 6 on the line B—B is 15 μm.

In the first high concentration layer, the junction depth on the line A'—A' is made 1/5-1/10 compared with that on the line B—B. In the second high concentration layer, the junction depth on the line A'—A' is made 1/7-1/15 compared with that on the line B—B.

By making such a construction, although on the line A'—A' there is p+-n-p+-n+ junction structure, the first high concentration n+ layer 4' and the second high concentration p+ layer 6' have remarkably shallow junction depth compared with that on line B—B. Referring to the equivalent circuit diagram shown in FIG. 3, the transistor $T_1$ (p+-n-p+) and the parasitic transistor $T_3$ (n-p+-n+) on the line A'—A' have much smaller current amplifying function compared with that of the conventional construction shown in FIG. 1. Accordingly, the emitter injection efficiency decreases and the current amplification function decreases.

In the embodiment shown in FIG. 16, at the anode surface constituting the aforementioned the other side of the semiconductor layer 2, the p+ layer 6, the p+ layer 6' and the n layer 21 located immediately below the buried gate region 8 are short circuited by the anode electrode 10 for instance by aluminium. Accordingly, the equivalent circuit diagram of this static induction thyristor becomes as shown in FIG. 17. This equivalent circuit diagram has just a resistor R connected between the emitter and base of the p-n-p transistor $T_1$ in addition to the equivalent circuit diagram shown in FIG. 3. The ratio of short circuit between the p+ layer 6, the p+ layer 6' and the n layer 21 is about 1 expressed by the surface area of the p+ layer and the n layer at the anode surface. Accordingly, as can be seen from the equivalent circuit diagram shown in FIG. 17, this thyristor is hardly affected by the influence of the current amplification function since this thyristor is formed of a p-n-p transistor $T_1$ having suppressed emitter injection efficiency, and a series connection of the static induction transistor $T_2$ and a parasitic transistor $T_3$ having less emitter injection efficiency. By this reason the dv/dt capability immediately after the turn-off can be made high. The gate loss at the turn-on of high frequency operation is small just as same as the embodiment shown in FIG. 14.

In this embodiment shown in FIG. 17, the gate-cathode blocking voltage has been improved just as same as the embodiment shown in FIG. 14 and the manufacturing yield had been much improved compared with the conventional embodiment shown in FIG. 1.

The aforementioned selective formation of the n+ layer 4 and the n+ layer 4' on one side surface 3 of the semiconductor layer 2, and the selective formation of the p+ layer 6 and p+ layer 6' on the other side surface 5 in the n layer 2 can be made by using known methods for the formation of oxidized film, photolithography, diffusion technique, and etc.

Figure 18:
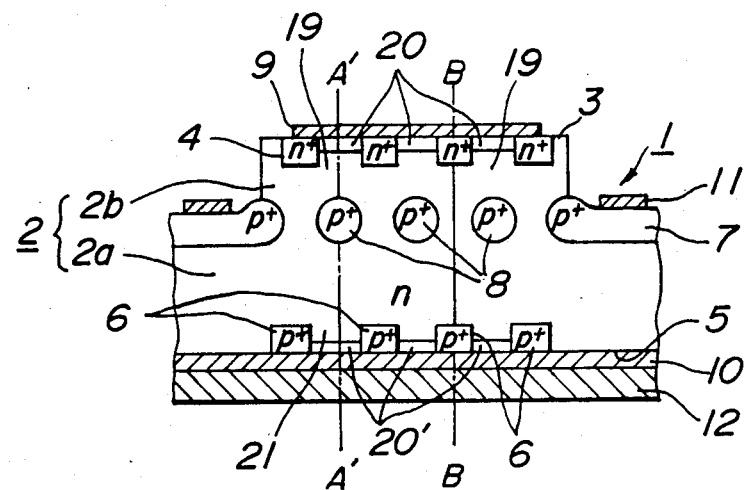
FIG. 18 is a diagrammatic cross-sectional view of a further embodiment of a static induction thyristor according to the present invention.

The embodiment shown in FIG. 18 is to further improve the effect of the embodiment shown in FIG. 16.

In this embodiment, insulating layers or insulating films 20 and 20', such as oxide films, nitride films are provided in the semiconductor layer 2, namely between the cathode electrode 9 and the region 19 immediately above the buried gate region 8 and between the anode electrode 10 and the region 21 immediately below the buried gate region 8. By the provision of the insulating layer 20, the current path directly coupling the cathode electrode 9 to n layer 4' located alternately with n+ layer 4 of the cathode surface forming one side surface 3 of the semiconductor layer 2 is electrically interrupted.

By the electric insulating function of the insulating layer 20, the blocking voltage between the gate and cathode can further be improved since the formation of the short-circuit between the n+ layer 4 and the n layer 4' via the cathode electrode 9 is avoided.

Furthermore, by the insulating action of this insulating layer 20 the operation of the parasitic n-p-n transistor $T_3$ shown in FIG. 3 is prevented and the equivalent circuit diagram becomes as shown in FIG. 2. By this reason, the dv/dt capability immediately after the turn-off of this thyristor of the FIG. 18 embodiment is much larger than that of the conventional thyristor shown in FIG. 1.

By this insulating layer 20, the current path from the buried gate region 8 to the partial region having only p-n junction among the whole current path towards the cathode electrode 9 is insulated and thus the current path is substantially limited to that corresponding to the region having only p+-n-n+ junction. Whereas in the conventional construction, no such insulating layer interrupting the aforementioned current path is provided. Accordingly, the current path in the thyristor of FIG. 18 embodiment is much narrower than that of the conventional thyristor shown in FIG. 1 and thus the current flowing through the path between the gate and the cathode decreases remarkably. In other words, the resistance between the gate and the cathode of the thyristor becomes high. By this reason, the thyristor of FIG. 18 embodiment has an advantage in that the gate loss at turn-on under high frequency operation is very small compared with the thyristor of the conventional construction shown in FIG. 1.

In the embodiment shown in FIG. 18, the occurrence of default due to defects of the epitaxial growing layer is avoided since the high concentration layer, i.e. the n+ diffusion layer is not provided at the region 19 of the semiconductor layer 2 located immediately above the buried gate region 8 having the gate area substantially larger than the channel area (in practice 1:6–1:10), and instead an insulating layer 20 is provided at the region 19 and electrically inactivated. Thus by the improvement of the gate-cathode blocking voltage, the manufacturing yield can be improved very much.

In addition to the above in this embodiment, the second high concentration layer, for instance p+ layer 6, is formed to have the insulation layer 20' at region 21 immediately below the buried gate region 8 viewing from the gate region 8 towards the other surface 5 of the semiconductor layer 2 normal thereto and to have p+ layer 6 in the other portion of the semiconductor layer 2. In such construction shown in FIG. 18, in the both regions 19 and 21 of the semiconductor layer 2 located immediately above and below the buried gate region 8 and situated oppositely against the cathode electrode 9 and the anode electrode 10, there are not provided with the first high concentration layer i.e. n+ layer 4 and the second high concentration layer i.e. p+ layer 6 and the cross-sectional construction on the line A'—A' is n-p+-n junction structure (3 layer transistor structure). Accordingly, in this embodiment there is no junction having injecting effect at the region 19 and the region 21 of the semiconductor layer located immediately above and below of the buried gate region 8. As the result in the embodiment shown in FIG. 18, the thyristor in the vertical cross-section is constructed only from an n-p+-n transistor and a p+-n-n+ diode. Furthermore, at the anode surface being the other side surface of the semiconductor layer 2, the p+ layer 6 and the n layer 21 are short circuited by the anode electrode for instance aluminium. Accordingly, the equivalent circuit diagram becomes as shown in FIG. 17. This circuit has a resistor R connected between the emitter and base of the p-n-p transistor $T_2$ as shown in the equivalent circuit diagram shown in FIG. 2. The short circuit ratio in the area between the p+ layer 6 and the n layer 21 is the ratio in the area of p+ layer and the n layer at the anode surface (area of p+ layer < area of n layer). Accordingly, the short circuit ratio becomes comparatively large value of about 6 to 10. Whereas the short circuit ratio of n/p+ in the conventional device has been less than unity.

Accordingly, as can be seen from this equivalent circuit diagram, this thyristor consists of a series coupling of a p-n-p transistor $T_1$ having suppressed emitter injection efficiency and a static induction transistor $T_2$. Therefore, this thyristor is hardly affected by the current amplification function, and the dv/dt capability immediately after the turn-off can be made high. Furthermore, the gate loss at the turn-on under high frequency operation is small just as same as the FIG. 14 embodiment.

The abovementioned selective formation of the insulating layer and the selective diffusion can be made easily through known oxidation technique, photolithography and etching technique.

As has been mentioned in the foregoing, the present invention is to improve the characteristics of the static induction thyristor having buried gate structure.

In the foregoing embodiments, the invention has been explained for n-channel type thyristor. However, it is apparent that the invention will have the similar effect when applied with p-channel type thyristor.

Figure 19:
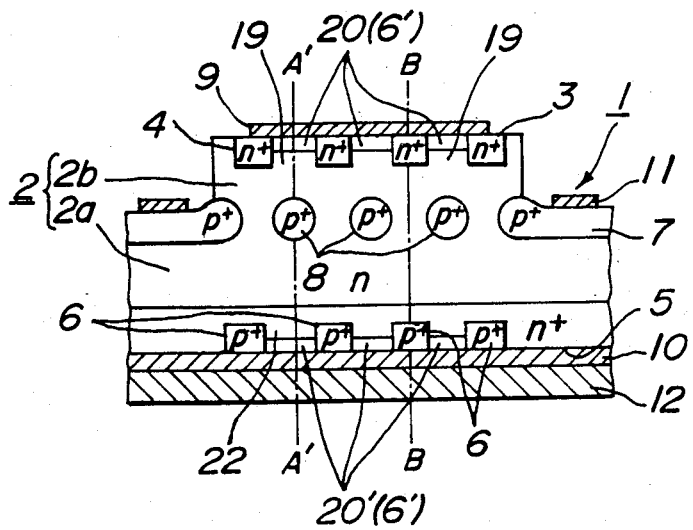
FIG. 19 is another diagrammatic cross-sectional view of a modified embodiment of a static induction thyristor according to the present invention.

Furthermore, as can be seen from FIG. 19 embodiment, the invention can equally be applied to a static induction thyristor having low resistance layer (n+ layer) 22 located between the anode electrode 10 and the n layer in a manner to surround the p+ layer 6 on the anode surface and the invention will have the same effects with the other embodiment mentioned in the foregoing.

The materials used for the formation of each of the regions forming the thyristor and the layers and other parts may be the known material in this field of technique.

What is claimed is:

1. A static induction thyristor comprising:
   a semiconductor layer having top and bottom surfaces,
   a first high impurity concentration layer provided on said semiconductor layer top surface,
   a second high impurity concentration layer provided on said semiconductor layer bottom surface,
   a cathode electrode connected to said first high impurity concentration layer,
   an anode electrode connected to said second high impurity concentration layer, and
   at least one buried gate region provided in said semiconductor layer and having lower, middle and upper zones of differing impurity concentration at different depths within the buried gate region, said lower zone having an impurity concentration on the order of $10^{18}$ atoms/cc, said middle zone overlying said lower zone and having an impurity concentration greater than that of said lower zone and on the order of $10^{19}$ atoms/cc, and said upper zone overlying said middle and lower zone and having an inpurity concentration less than that of said lower and middle zones and on the order of $10^{17}$ atoms/cc, whereby the impurity concentration within the buried gate region has two stepwise variations in concentration.

2. A static induction thyristor comprising:
   a semiconductor layer having top and bottom surfaces,
   a first high impurity concentration layer provided on said semiconductor layer top surface,
   a second high impurity concentration layer provided on said semiconductor layer bottom surface,
   a cathode electrode connected to said first high impurity concentration layer,
   an anode electrode connected to said second high impurity concentration layer, and
   at least one buried gate region provided in said semiconductor layer and having lower, middle and upper zones of differing impurity concentration at different depths within the buried gate region, said lower zone having an impurity concentration on the order of $10^{19}$ atoms/cc, said middle zone overlying said lower zone and having an impurity concentration less than that of said lower zone and on the order of $10^{18}$ atoms/cc, and said upper zone overlying said middle and lower zone and having an impurity concentration less than that of said lower and middle zones and on the order of $10^{17}$ atoms/cc, whereby the impurity concentration within the buried gate region has two stepwise variations in concentration.

3. A static induction thyristor as claimed in claim 1 or 2, wherein said first high impurity concentration layer is provided on said semiconductor layer except in a region aligned directly above said buried gate region, viewed from the buried gate region towards said top surface in a direction normal to said surface, and wherein an insulating layer is provided in said region aligned directly above the buried gate region.

4. A static induction thyristor as claimed in claim 1 or 2, wherein said first high impurity concentration layer includes a shallow junction depth at a region aligned directly above said buried gate region viewed from said buried gate region towards said top surface in a direction normal to said surface, and a deep junction depth at the remainder of the region on said semiconductor layer, and wherein said second high impurity concentration layer includes a shallow junction depth at a region aligned directly below said buried gate region viewed from said buried gate region towards said bottom surface in a direction normal to said surface, and a deep junction depth at the remainder of the region in said semiconductor layer, and wherein said first high impurity concentration layer is an $n^+$ layer.

5. A static induction thyristor as claimed in claim 1 or 2, wherein said first high impurity concentration layer is provided on said semiconductor layer except in a region aligned directly above said buried gate region viewed from the buried gate region towards said top surface in a direction normal thereto, and said second high impurity concentration layer is provided on said semiconductor layer except in a region aligned directly below said buried gate region viewed from the buried gate region toward said bottom surface in a direction normal thereto, and wherein an insulating layer is provided between said cathode and said region aligned directly above said buried gate region and an insulating layer is provided between said anode and said region aligned directly below said buried gate region wherein said first high impurity concentration layer is an $n^+$ layer.

6. A static induction thyristor as claimed in claim 1 or 2, wherein in a region aligned directly below said buried gate region, viewed from the buried gate region towards the anode electrode side in a direction normal thereto, no semiconductor layer having the same conductivity type with that of the buried gate is provided, and said second high impurity concentration layer is short circuited by the anode electrode against the semiconductor layer having opposite conductivity type with the buried gate.

* * * * *